(12) United States Patent
Chowdhury et al.

(10) Patent No.: US 8,739,012 B2
(45) Date of Patent: May 27, 2014

(54) CO-HOSTED CYCLICAL REDUNDANCY CHECK CALCULATION

(75) Inventors: Prohor Chowdhury, Bangalore (IN); Alexander Tessarolo, Lindfield (AU)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 13/523,242

(22) Filed: Jun. 14, 2012

(65) Prior Publication Data

US 2012/0324321 A1 Dec. 20, 2012

Related U.S. Application Data

(60) Provisional application No. 61/497,465, filed on Jun. 15, 2011.

(51) Int. Cl.
*G06F 11/00* (2006.01)
*H03M 13/09* (2006.01)
*G06F 11/20* (2006.01)

(52) U.S. Cl.
CPC ............ *H03M 13/09* (2013.01); *G06F 11/2056* (2013.01); *G06F 11/2084* (2013.01)
USPC .......................................... 714/801; 714/768

(58) Field of Classification Search
CPC ............... H03M 13/09; G06F 11/2056; G06F 11/2084; G06F 11/2094
USPC ............................ 714/758, 763, 768, 801, 807
See application file for complete search history.

(56) References Cited

U.S. PATENT DOCUMENTS

| 7,080,198 | B1 * | 7/2006 | Young ........................... 711/114 |
| 7,237,141 | B2 * | 6/2007 | Fredin .......................... 714/6.21 |
| 2003/0163756 | A1 * | 8/2003 | George ............................. 714/5 |
| 2004/0088497 | A1 * | 5/2004 | Deans et al. ................... 711/146 |
| 2006/0101215 | A1 * | 5/2006 | Yuasa ............................ 711/162 |
| 2008/0052568 | A1 * | 2/2008 | Hillier et al. .................. 714/718 |
| 2010/0199146 | A1 * | 8/2010 | Sato et al. ..................... 714/758 |

OTHER PUBLICATIONS

Ziakas, D.; Baum, A.; Maddox, R.A.; Safranek, R.J.; , "Intel® QuickPath Interconnect Architectural Features Supporting Scalable System Architectures," High Performance Interconnects (HOTI), 2010 IEEE 18th Annual Symposium on , vol., No., pp. 1-6, Aug. 18-20, 2010.*
Jovanovic, M.; Milutinovic, V.; , "An overview of reflective memory systems," Concurrency, IEEE , vol. 7, No. 2, pp. 56-64, Apr.-Jun. 1999.*

* cited by examiner

*Primary Examiner* — Cynthia Britt
(74) *Attorney, Agent, or Firm* — John R. Pessetto; Wade J. Brady, III; Frederick J. Telecky, Jr.

(57) ABSTRACT

A co-hosted cyclical redundancy check (CRC) calculations system is arranged to use a processor to generate initial addresses for reading the data from a mirrored device that has address ranges over which a CRC result is to be calculated. An memory mapping unit detects when the initial address falls within an address range over which the CRC result is to be calculated. A read snoop unit snoops the data read from a mirrored memory that has data stored using a mirrored address. A CRC co-generator receives the snooped data read from mirrored memory and uses the snooped data read from the mirrored memory to calculate the CRC result.

20 Claims, 4 Drawing Sheets

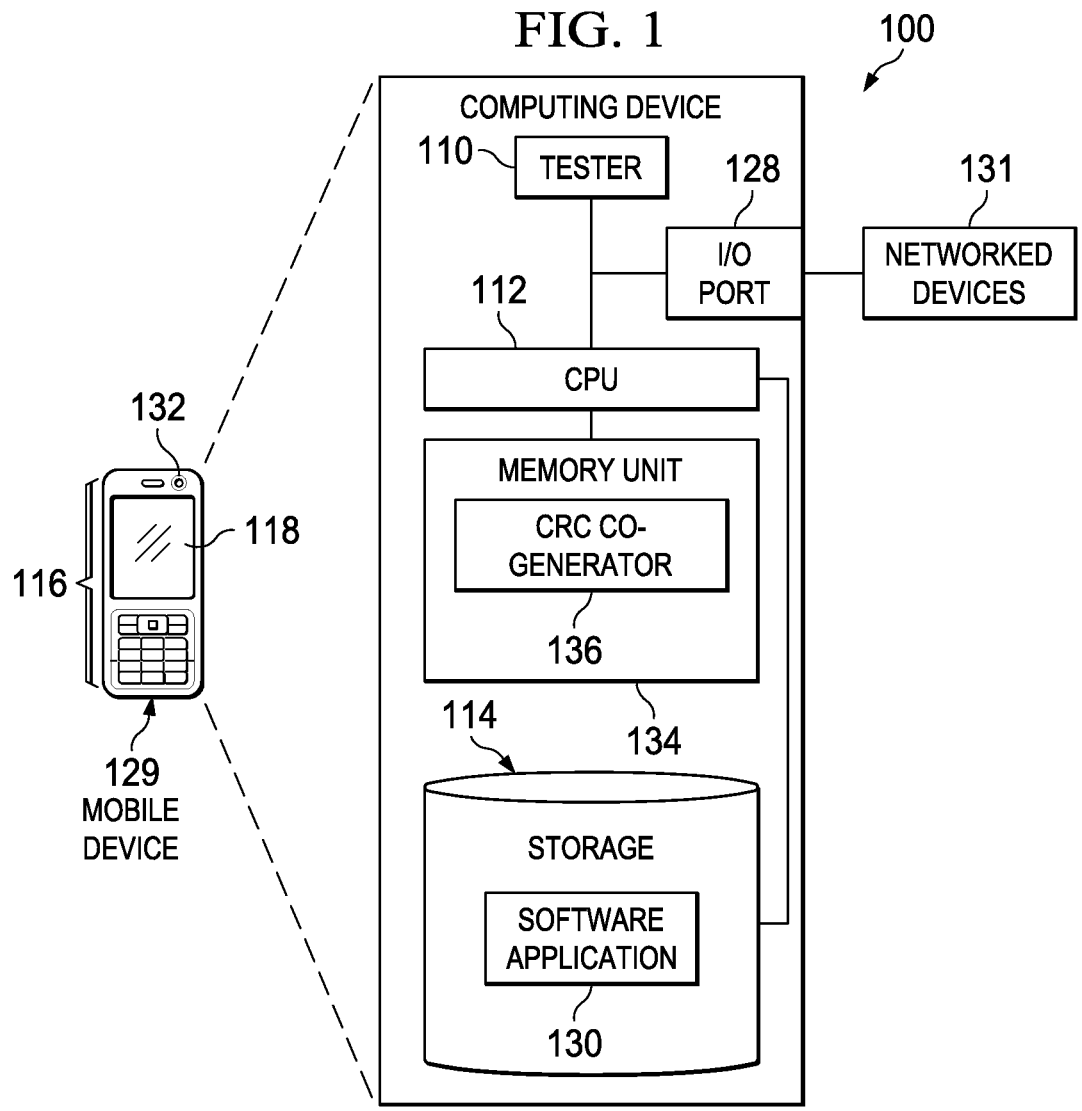

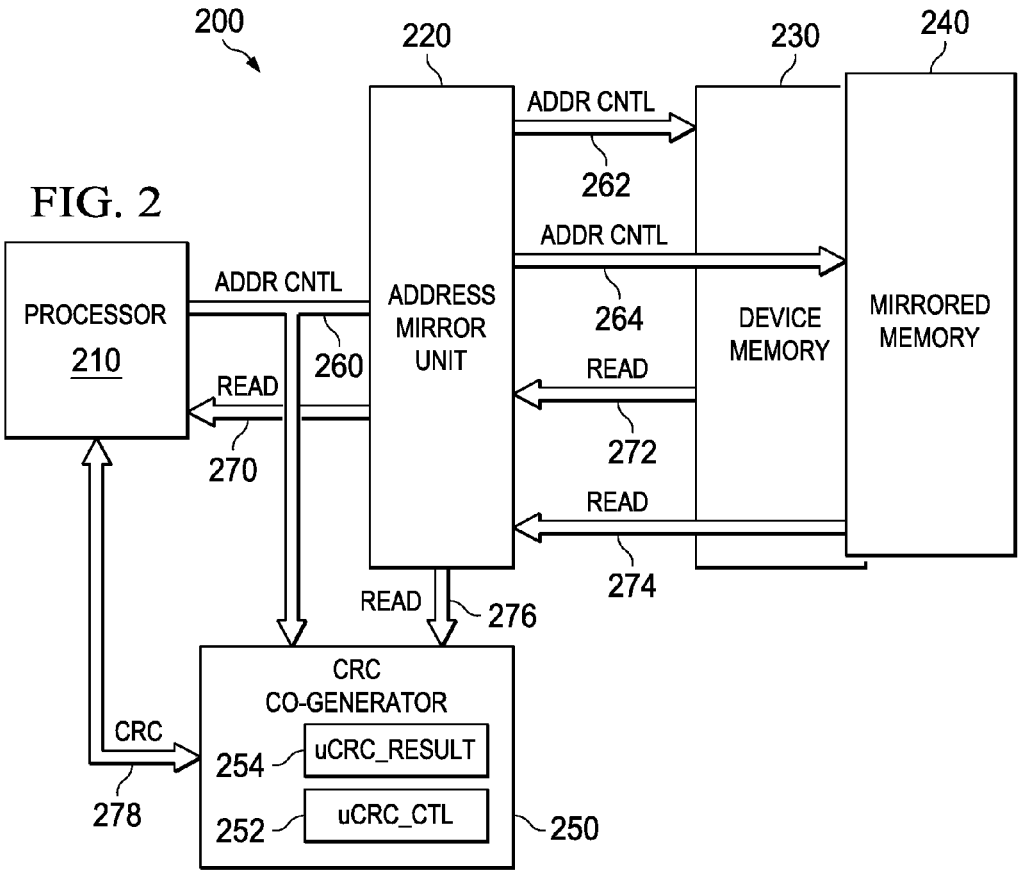
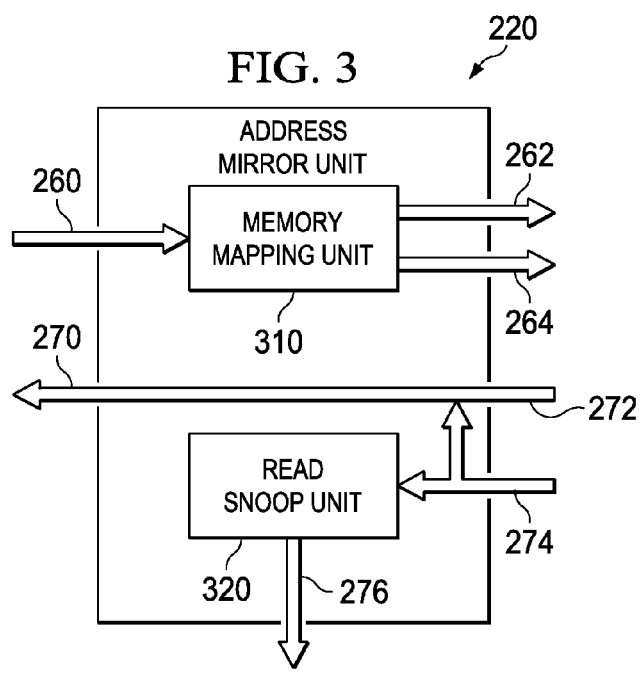

FIG. 4

| MEMORY MODULE | ADDRESS MAP FOR PROCESSOR | ADDRESS MAP FOR CRC CO-GENERATOR |
|---|---|---|
| M3-ROM | 0x0000-0000 TO 0x0000-FFFF | 0x0400-0000 TO 0x0400-FFFF |
| M3-FLASH-BANK | 0x0020-0000 TO 0x0027-FFFF | 0x0420-0000 TO 0x0427-FFFF |
| M3-OTP-BANK | 0x0040-0000 TO 0x0040-0FFF | 0x0440-0000 TO 0x0440-0FFF |
| C0 | 0x2000-0000 TO 0X2000-1FFF | 0x2400-0000 TO 0x2400-1FFF |
| C1 | 0x2000-2000 TO 0x2000-3FFF | 0x2400-2000 TO 0x2400-3FFF |
| C2 | 0x2000-4000 TO 0X2000-5FFF | 0x2400-4000 TO 0x2400-5FFF |
| C3 | 0x2000-6000 TO 0X2000-7FFF | 0x2400-6000 TO 0x2400-7FFF |
| S0 | 0x2000-8000 TO 0X2000-BFFF | 0x2400-8000 TO 0x2400-BFFF |
| S1 | 0x2000-C000 TO 0X2000-FFFF | 0x2400-C000 TO 0x2400-FFFF |
| S2 | 0x2001-0000 TO 0X2001-3FFF | 0x2401-0000 TO 0x2401-3FFF |
| S3 | 0x2001-4000 TO 0X2001-7FFF | 0x2401-4000 TO 0x2401-7FFF |
| MSG-RAM-C28xTOM3 | 0x2007-F000 TO 0X2007-F7FF | 0x2407-F000 TO 0x2407-F7FF |
| MSG-RAM-M3TOC28x | 0X2006-F800 TO 0x2007-FFFF | 0x2406-F800 TO 0x2407-FFFF |

410    420    430

US 8,739,012 B2

CO-HOSTED CYCLICAL REDUNDANCY CHECK CALCULATION

CLAIM OF PRIORITY

This application for patent claims priority to U.S. Provisional Application No. 61/497,465 entitled "A low cost method of computing CRC on memory data by snooping the read interface the main processor" filed 15, Jun. 2011, wherein the application listed above is incorporated by reference herein.

BACKGROUND

Numerical processing techniques (such as cyclical redundancy check calculations) are performed to help validate data that is digitally stored and/or transmitted. Processing systems can use a main processor (for example) to calculate a CRC calculation, but this may be unacceptable depending on the relative availability of processing throughput of the processor.

To reduce the length of time required to perform a CRC (cyclical redundancy check) calculation, dedicated CRC-engines are present in many systems on-chip (SOCs). The dedicated CRC engines typically include a CRC address generation unit and a separate read bus for accessing data directly from memory. Thus, the dedicated CRC engines are normally more complicated due to the presence of address generation unit and separate read bus, both of which complicate the bus architecture of the chip. The dedicated CRC engines typically consume substantial portions of chip area and power.

SUMMARY

The problems noted above are solved in large part by a co-hosted cyclical redundancy check (CRC) calculations system and method having a co-hosted CRC engine that is arranged to obtain the data for a CRC calculation by snooping (e.g., tapping) the read-data bus of a main processor. Tapping the read data bus of the processor to obtain data for a CRC calculation simplifies chip bus architecture as the co-hosted CRC engine is normally passive (and is thus not required to perform active bus mastering to perform a CRC calculation). In an embodiment, the co-hosted CRC engine also is not required to provide address generation logic because memory address generation is typically performed by the main processor itself.

A co-hosted cyclical redundancy check (CRC) calculations system is arranged to use a processor to generate initial addresses for reading the data from a mirrored device that has address ranges over which a CRC result is to be calculated. An memory mapping unit detects when the initial address falls within an address range over which the CRC result is to be calculated. A read snoop unit snoops the data read from a mirrored memory that has data stored using a mirrored address. A CRC co-generator receives the snooped data read from mirrored memory and uses the snooped data read from the mirrored memory to calculate the CRC result.

BRIEF DESCRIPTION OF THE DRAWINGS

FIG. 1 shows an illustrative computing device in accordance with preferred embodiments of the disclosure;

FIG. 2 is a schematic diagram illustrating co-hosted CRC generation in accordance with preferred embodiments of the disclosure;

FIG. 3 is a schematic diagram illustrating an address mirror unit used in co-hosted CRC generation in accordance with preferred embodiments of the disclosure;

FIG. 4 is a logic diagram illustrating an address map used in co-hosted CRC generation in accordance with preferred embodiments of the disclosure.

DETAILED DESCRIPTION

Figure 5:
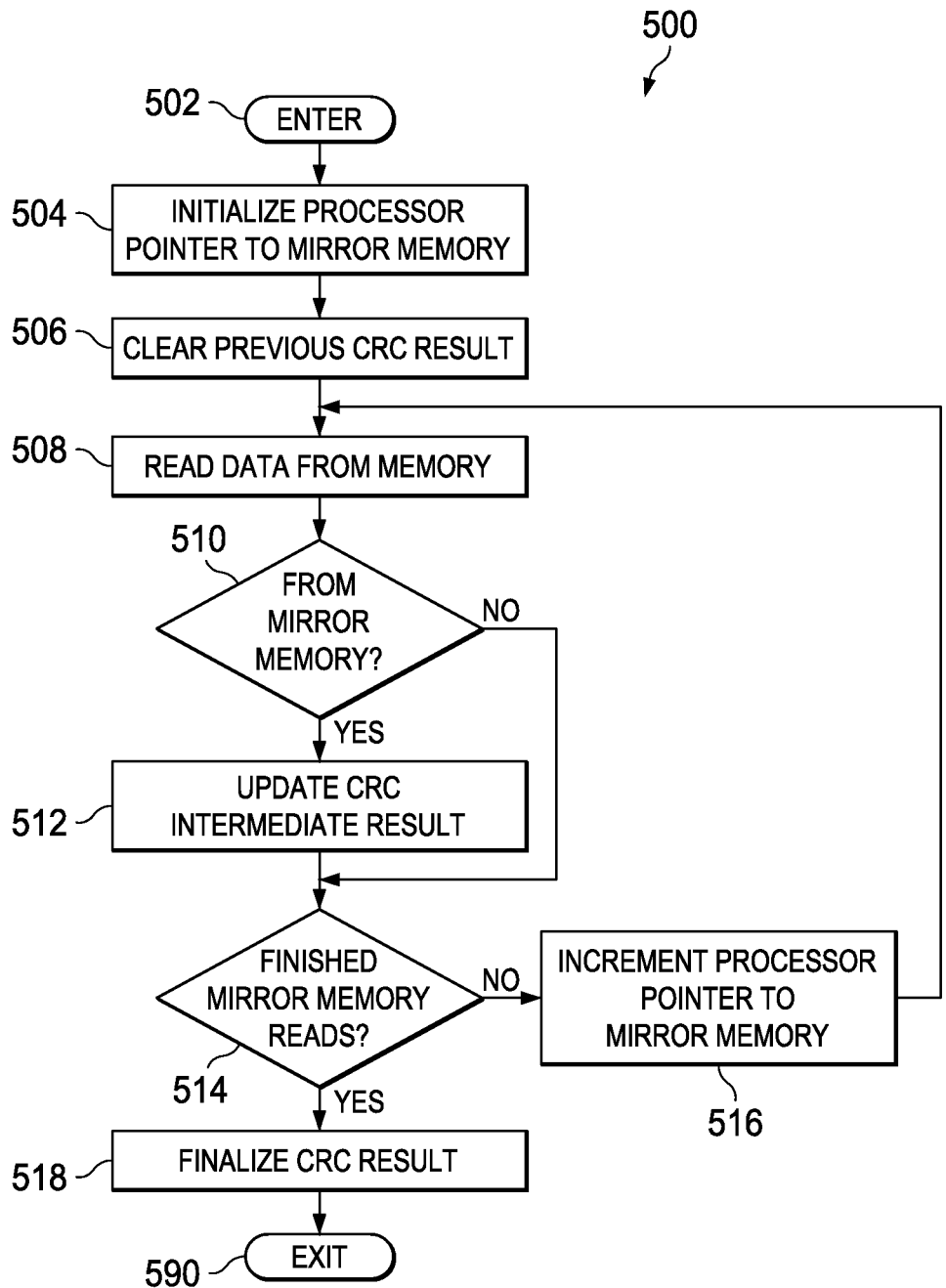
FIG. 5 is a flow diagram illustrating co-hosted calculation of a CRC result for a selected memory module in accordance with preferred embodiments of the disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

FIG. 1 shows an illustrative computing device 100 in accordance with preferred embodiments of the disclosure. For example, the computing device 100 is, or is incorporated into, a mobile communication device 129, such as a mobile phone, a personal digital assistant, a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The CPU 112 can include (or be coupled to) memory unit 134, which includes synchronous (or asynchronous) logic arranged in a common (or separate) substrate. Memory unit 134 includes a CRC co-generator 136 that shares CRC-calculation duties with a main processor as disclosed herein below.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

As disclosed herein, a CRC co-generator 136 that shares CRC-calculation duties with a main processor is used to significantly improve the processing performance of CRC calculations (while reducing area and power requirements over conventional solutions). CRC calculations are performed using a CRC co-generator 136 coupled to the read interface of the processor. The CRC co-generator 136 "snoops" (e.g., examines but does not assert addresses for reading data) the read-data bus to obtain the data used to perform the CRC computation.

FIG. 2 is a schematic diagram illustrating co-hosted CRC generation in accordance with preferred embodiments of the disclosure. System 200 includes processor 210, address mirror unit 220, device memory 230, mirrored memory 240, and CRC co-generator 250. The processor 210 is arranged to generate addresses and control signals for reading from and writing to, for example, device memory 230 via address control (ADDR CNTL) bus 260. The address mirror unit 220 is arranged to apply the address control bus 260 signals to the device memory 230 via the address control bus 262, and to apply the address control bus 260 signals to the mirrored memory 240 via the address control bus 264.

Address mirror unit 220 is arranged to receive read data from the device memory 230 via read bus 272, and is arranged to also receive read data from the mirrored memory 240 via read bus 274. The address mirror unit 220 is arranged to forward the received read data to the processor 210 via read a bus 270. The address mirror unit 220 is also arranged to snoop the read bus 274 and to provide the snooped read data (including addresses and related control signals) to the CRC co-generator 250 via read bus 276. Thus, the mirrored memory 240 is arranged to retrieve data as if the memory had been stored in device memory 230.

The mirrored memory 240 is arranged to store data for which CRC calculations are desired (for example, to ensure data integrity of the stored data). The mirrored memory 240 in various embodiments can be the same physical memory (e.g., RAM, ROM, flash modules, and the like) as the device memory 230. The mirrored memory 240 is optionally mapped to an address space ("married address space") that is different from the logical address space that the main processor uses to address the mirrored memory 240.

Typically, all of the physical memories (e.g. RAM, ROM, flash modules and the like) are mapped to the processor's address map. Over this address map, the processor can perform instruction fetches, data reads and writes as used in any general purpose application. When the processor address bus is 32 bits wide (for example), the processor can typically access up to 4 gigabytes of memory space. In many cases, the addressable memory is not completely filled by physical memory, which leaves free space in the processor addressable space.

In an embodiment, each memory cell (for which a CRC calculation is desired) of the physical memory is also mapped to a location in duplicate address range (called the mirrored address range) utilizing the available and/or free processor addressable memory space. As described further below, the address mirror unit 220 is arranged to determine which memory accesses by a processor 210 are directed towards blocks of memory locations for which CRC calculations are desired. Thus data read from mirrored memory 240 (which is physical memory mapped to addresses in the mirrored address range) is forwarded to CRC co-generator 250 to be used in performing CRC calculations.

In operation, CRC calculations are performed upon a block (e.g., range) of memory locations by an application directing the processor 210 to read each of the memory locations stored in a block of memory locations for which the CRC calculation is desired (e.g., by "throwing" read instructions to a block of corresponding mirrored addresses). The CRC co-generator 250 performs the CRC calculation using each read value that is snooped from the mirrored memory 240. Using the mirrored memory retrieve data for the CRC calculation thus avoid reading any extraneous data that may appear on a data bus due to, for example, (unscheduled) interrupts or (loop) program variables being read while executing reads of each of the memory locations stored in a block of memory locations for which the CRC calculation is desired.

To initialize the CRC calculations that are performed upon a selected block of memory locations, the processor 210 initializes the control register (uCRC_CTL) 252 of CRC co-generator 250 via CRC bus 278, for example. The processor 210 is able to both read from and write to the control register 252, which allows, for example nested computation of CRC values to execute while handling interrupt service routines (without the interrupt service routines corrupting results of any of the nested CRC calculations). The processor 210 performs read operations of each memory location in a block of memory locations for which the CRC calculation is desired. The read operations entail generating the addresses used to retrieve the data to be used for the CRC calculation, which offloads circuitry that would otherwise be required by the CRC co-generator 250 to generate the addresses used to retrieve the data to be used for the CRC calculation.

CRC calculations can be performed on data (stored in the physical memory modules) as required by the application, as well as data within the range of addresses which store code (including the interrupt service routines) for safety reasons. Many safety standards often require an executable application to check the health of the memory in which the application is stored. Accordingly, for such safety-critical applications, CRC computations are often performed on the memory modules that are partitioned to store application code (which often include the interrupt service routines).

In an embodiment, the initial addresses generated by the processor 210 are mirrored addresses that are used to address the mirrored memory 240. The mirrored address are used such that each of the read operations of each memory location in a block of memory locations for which the CRC calculation is desired is retrieved from the mirrored memory 240.

Each value of each of the read operations of each memory location in a block of memory locations for which the CRC calculation is desired is snooped by the CRC co-generator 250 via read bus 276, for example. Each of the snooped read values is used to update an intermediate (or initial) CRC value that is stored in the result register (uCRC_RESULT) 254. When the processor 210 finishes reading each of the memory locations in a block of memory locations for which the CRC calculation is desired, the processor 210 retrieves the CRC result by reading the result register 254 via CRC bus 278, for example. (The processor 210 is also able to write to the result register 254 to initialize a CRC intermediate value, for example.)

Code for the processor 210 to generate addresses for causing the read operations of each memory location in a block of memory locations for which the CRC calculation is desired can be expressed as follows:

```
char crc_calculation (unsigned long mirrored_address_location,
unsigned int block length)
    {
        unsigned int i;
        char dummy_var;
        char *memory_data_pointer = (char *)
        mirrored_address_location;
        *uCRC_CTL = 1;              //clear previous CRC result
        for (i = 0;i<block length;++i)   //loop for number of bytes in
                                          data block
        {
            dummy_var = *memory_data_pointer++; //generate
            snoop addresses
        }
        return (*uCRC_RESULT);   //read the CRC result register and
        return value
    }
```

Mirroring of the memory locations for which the CRC calculation is desired facilitates the co-generation of the CRC calculation in the following ways. When a read is directed to the mirrored address location, it provides an indication to the CRC co-generator 250 that the data which on the read-data bus 274 from the mirrored memory 240 is to be used (e.g., snooped) for CRC calculation. Likewise, if the processor 210 is interrupted while CRC computation is being performed by the CRC co-generator 250, the CRC computation (at the point of the interrupt) is not normally corrupted due to unrelated data appearing on the read-data bus due to the interrupt when the unrelated data is read from an area of memory that is not being used for the CRC computation.

For example, context restoration-related data from the stack, un-related reads from handling interrupt service routines, and the like do not corrupt the CRC computation when the areas in which the unrelated data is stored are selected to be outside the range of a current CRC computation. Thus unrelated data (that would corrupt the current CRC computation) does not appear on the read-data bus from the mirrored addresses. When code execution of the processor 210 is prevented from reading instructions from the mirrored address locations, literal pool loading (e.g., reading of program constants) is prevented (or at least reduced) from the mirrored address locations.

Accordingly, the CRC co-generator 250 is not necessarily a stand-alone CRC computation engine. The CRC co-generator 250 works in conjunction with the processor 210 resources (e.g. address generation, control signal generation, data buses, and the like) to perform the CRC calculation, which substantially improves the efficiency of the CRC calculation (as compared with using the processor 210 to perform the CRC calculation itself, for example).

FIG. 3 is a schematic diagram illustrating an address mirror unit used in co-hosted CRC generation in accordance with preferred embodiments of the disclosure. Address mirror unit 220 includes an memory mapping unit 310 and a read snoop unit 320. Memory mapping unit 310 is arranged to selectively couple the address control bus 260 signals to the device memory 230 via the address control bus 262, and to selectively apply the address control bus 260 signals to the mirrored memory 240 via the address control bus 264. The memory mapping unit 310 is arranged to selectively couple the initial addresses generated by the processor 210 as mirrored addresses.

The (output) control bus 262 or 264 is selected as follows. When the data is addressed to a memory location that is unrelated to a block of memory for which a CRC calculation is desired, the memory mapping unit 310 selectively couples the address control bus 260 signals to the device memory 230 via the address control bus 262. When the data is addressed to a memory location that is located within a block of memory for which a CRC calculation is desired, the memory mapping unit 310 selectively couples the address control bus 260 signals to the mirrored memory 240 via the address control bus 264. Accordingly, data related to the CRC calculation is stored in mirrored memory 240 via the address control bus 264, whereas data unrelated to the CRC calculation is stored in the device memory 230 via the address control bus 262.

Address mirror unit 220 is arranged to selectively receive read data from the device memory 230 via read bus 272, and is arranged to also selectively receive read data from the mirrored memory 240 via read bus 274. Address control bus 262 is arranged to assert control signals for the device memory 230 such that the data to be read from the device memory 230 appears on read bus 272. Likewise, address control bus 264 is arranged to assert control signals for the mirrored memory 240 such that the data to be read from the mirrored memory 240 appears on read bus 274.

The address mirror unit 220 is arranged to forward the received read data (from read buses 272 and 274) to the processor 210 via read a bus 270. Also, the read snoop unit is arranged to snoop the read bus 274 and to provide the snooped read data (which is thus retrieved from memory blocks or modules for which CRC calculations are desired) to the CRC co-generator 250 via read bus 276. The CRC co-generator 250 performs the CRC calculations as described, for example, below with reference to FIG. 5.

FIG. 4 is a logic diagram illustrating an address map used in co-hosted CRC generation in accordance with preferred embodiments of the disclosure. Address map 400 is an address map that can be used by memory mapping unit 310 to select between the device memory 230 and the mirrored memory 240 and to detect the memory addresses for the data to be stored and/or retrieved in the mirrored memory 240.

Memory map 400 includes a column 410 that lists each memory module (or a portion of a physical memory that the processor 210 can address. Memory map 400 also includes a column 420 that provides the address range over which each associated memory module is mapped for regular application use. The column 430 of the memory map 400 provides the mirrored address range for each of the associated memory modules.

In an embodiment, the application related instructions (such as a fetch, read, or write) fall within one of the address ranges provided in column 420. When the processor 210 is generating addresses used for retrieving data to be used in a CRC calculation, the generated addresses are "thrown" to the corresponding addresses in column 430 (which are the corresponding mirror locations). The resulting CRC calculations are not corrupted because, for example, application-related reads and CRC-related reads are distinguishable by using the disclosed memory map 400.

FIG. 5 is a flow diagram illustrating co-hosted calculation of a CRC result for a selected memory module in accordance with preferred embodiments of the disclosure. Although the process 500 is described in terms of calculating the CRC result for a memory module, it is understood that the CRC can be calculated for a particular range of memory that is not necessarily delimited by the entire address range of a particular memory module. Additionally, the CRC can be calculated over a range that spans multiple memory modules.

The program flow is initiated at enter node 502 and proceeds to operation 504. In operation 504, the pointer to the mirror memory is initialized using (for example) the location of a memory module as specified in the processor-generated addresses of column 420 of the memory map 420. The memory module to be tested can be specified (for example) by writing the base address of the memory module to be tested to control register 252. In operation 506, the previous CRC result is cleared (by writing, for example, a value of "0" to the result register 254 of the CRC co-generator 250). When executing nested CRC calculations (in interrupt service routines, for example), the previous CRC result can be saved by "pushing" the previous CRC result onto a program data stack and subsequently "popping" the saved previous CRC result when returning to the CRC calculation process for which the previous CRC result was pushed onto the stack. Program flow continues in operation 508.

In operation 508, data is read from memory using processor-generated addresses. The processor generates read addresses for each of the memory locations under the control of a "for loop," for example, where the read address is incremented during each iteration of the loop. Because of the possibility of an execution-time interrupt, in operation 510 data read by the read snoop unit 320 is evaluated to determine whether the snooped data has been retrieved from mirror memory. If the snooped data has been retrieved from mirror memory, in operation 512 the CRC intermediate result is updated by writing to the CRC result register 254 in program flow continues to operation 514. If the snooped data has not been retrieved from mirror memory, the CRC intermediate result is not updated and the program flow continues to operation 514.

In operation 514, it is determined whether the process of reading of all memory locations listed from the selected memory module has been finished. If the process of reading of all memory locations listed from the selected memory module has not been finished, program flow continues to operation 516 where the mirror memory read address pointer is incremented by the processor and program flow continues to operation 508. If the process of reading of all memory locations listed from the selected memory module has been finished, program flow continues to operation 518.

In operation 518, the result in the CRC result register 254 is finalized and the CRC control register 252 can be updated to reflect a successful conclusion of the co-hosted generated CRC result for the memory stored in a selected memory module. Program flow continues to node 590 where the co-hosted process to calculate a CRC result for a selected memory module is terminated.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A co-hosted cyclical redundancy check (CRC) calculations device, comprising
    a read snoop unit that is arranged to snoop data read from a mirrored memory that has data stored using a mirrored address; and
    a CRC co-generator that is arranged to receive the snooped data read from the mirrored memory and to use the snooped data read from the mirrored memory to calculate a CRC result when the snooped data read from the mirrored memory is read using an address that falls within a range of addresses of the mirrored memory over which the CRC result is calculated;
    wherein the mirrored memory is a memory that addresses the same physical memory on a processor memory map using duplicated addresses.

2. The device of claim 1, comprising a processor that is arranged to service interrupt routines for the processor, wherein the instructions for the interrupt service routines are fetched from memory locations other than from within the range of addresses of the mirrored memory over which the CRC result is calculated.

3. The device of claim 1, wherein an memory mapping unit is used to detect when the mirrored memory is read using an address that falls within the range of addresses of the mirrored memory over which the CRC result is calculated.

4. The device of claim 3, wherein the memory mapping unit is arranged to generate the mirrored address by using a memory device offset stored in a memory map of the memory mapping unit.

5. The device of claim 4, wherein the address map provides a memory device offset for each memory device having a range of addresses for which the CRC result is to be calculated.

6. The device of claim 5, comprising a memory device that is arranged to store instruction data used for processor interrupt routines, wherein the memory device that is arranged to store data used for processor interrupt routines is arranged to use an initial address that is not a mirrored address when reading the instruction data.

7. The device of claim 6, wherein the instruction data is stored in memory locations other than from within the range of addresses of the mirrored memory over which the CRC result is calculated.

8. The device of claim 7, wherein the CRC co-generator is arranged to store an intermediate result in a result register before all data from the range of addresses of the mirrored memory over which the CRC result is calculated has been read.

9. The device of claim 8, wherein the result register is arranged to be read by a processor that is arranged to generate the initial addresses for reading the data to be snooped from the mirrored device.

10. The device of claim 1, wherein the processor is arranged to nest CRC calculations by using a stack to temporarily store the intermediate CRC result read from the result register.

11. A co-hosted cyclical redundancy check (CRC) calculations system, comprising a processor that is arranged to generate mirrored addresses for reading the data from a mirrored device that has address ranges over which a CRC result is to be calculated;

an memory mapping unit that is arranged detect when a mirrored address falls within an address range over which the CRC result is to be calculated;

a read snoop unit that is arranged to snoop data read from a mirrored memory that has data stored using a mirrored address; and a CRC co-generator that is arranged to receive the snooped data read from the mirrored memory and to use the snooped data read from the mirrored memory to calculate the CRC result;

wherein the mirrored address duplicates addresses to the same physical memory on a processor memory map.

12. The system of claim 11, wherein the processor that is arranged to generate the mirrored addresses for reading the data to be snooped from the mirrored device is arranged to handle interrupt routines for the processor.

13. The system of claim 12, wherein the instructions for the interrupt service routines are fetched from memory locations other than the range of addresses of the mirrored memory over which the CRC result is calculated.

14. The system of claim 11, wherein the memory mapping unit includes an address map that is arranged to provide a range of addresses for which the CRC result is to be calculated, wherein the range of addresses is used to detect a mirrored address for each memory device over which the CRC result is to be calculated.

15. The system of claim 14, wherein the CRC co-generator is arranged to store an intermediate result in a result register that is arranged to be read by the processor that is arranged to generate the mirrored addresses for reading the data to be snooped from the mirrored device.

16. A method for calculating cyclical redundancy check (CRC) results for the data in a memory block, comprising using a processor to generate addresses for reading mirrored data from a mirrored device that has address ranges over which a CRC result is to be calculated;

detecting when an address used to read the mirrored data falls within an address range over which the CRC result is to be calculated;

snooping snoop data read from a mirrored memory that has data stored using a mirrored address in response to the detection of an address used to read the mirrored data falls within an address range over which the CRC result is to be calculated; and using the snooped data read from the mirrored memory to calculate the CRC result that is calculated externally from the processor;

wherein the mirrored memory is a memory that addresses the same physical memory on a processor memory map using duplicated addresses.

17. The method of claim 16, comprising to using a processor to generate the addresses for reading the data to be snooped from the mirrored device, wherein the processor is arranged to handle interrupt routines for the processor while calculating the CRC result using mirrored data from the mirrored memory having an address range over which the CRC result is to be calculated.

18. The method of claim 17, wherein the instructions for the interrupt routines are fetched from memory locations other than the range of addresses of the mirrored memory over which the CRC result is calculated.

19. The method of claim 16, comprising providing an address map that includes a range of addresses for each memory device over which the CRC result is to be calculated.

20. The method of claim 19, comprising reading the CRC result from a register that is external to the processor.

* * * * *